US009287106B1

(12) United States Patent
Miao et al.

(10) Patent No.: US 9,287,106 B1
(45) Date of Patent: Mar. 15, 2016

(54) TRANSLUCENT ALUMINA FILAMENTS AND TAPE CAST METHODS FOR MAKING (71) Applicant: Corning Incorporated, Corning, NY (US)

(72) Inventors: Weiguo Miao, Horseheads, NY (US); Nathan Michael Zink, Painted Post, NY (US)

(73) Assignee: CORNING INCORPORATED, Corning, NY (US)

( * ) Notice: Subject to any disclaimer, the term of this patent is extended or adjusted under 35 U.S.C. 154(b) by 0 days.

(21) Appl. No.: 14/662,904

(22) Filed: Mar. 19, 2015

Related U.S. Application Data (60) Provisional application No. 62/077,437, filed on Nov. 10, 2014.

(51) Int. Cl.
| | |
|---|---|
| *H01J 1/62* | (2006.01) |
| *H01K 3/02* | (2006.01) |
| *C01F 7/02* | (2006.01) |
| *F21K 99/00* | (2010.01) |
| *F21V 19/00* | (2006.01) |
| *F21Y 103/00* | (2006.01) |

(52) U.S. Cl.
CPC .. *H01K 3/02* (2013.01); *C01F 7/02* (2013.01); *F21K 9/1355* (2013.01); *F21K 9/56* (2013.01); *F21K 9/90* (2013.01); *F21V 19/002* (2013.01); *F21Y 2103/003* (2013.01)

(58) Field of Classification Search
CPC .............. H01K 3/02; C01F 7/02; F21K 9/90; F21K 9/56; F21K 9/1355; F21V 19/002
See application file for complete search history.

(56) References Cited

U.S. PATENT DOCUMENTS

| 5,587,346 | A | 12/1996 | Zuk ............................... 501/152 |
| 5,625,256 | A | 4/1997 | Tiedt et al. .................... 313/636 |
| 5,631,201 | A | 5/1997 | Wei et al. ....................... 501/152 |
| 6,287,249 | B1 | 9/2001 | Tam et al. ........................... 600/3 |
| 6,306,788 | B1 | 10/2001 | Watanabe et al. .............. 501/153 |
| 6,420,287 | B1 | 7/2002 | Sakamoto et al. ................. 501/4 |
| 6,482,761 | B1 | 11/2002 | Watanabe et al. .............. 501/153 |
| 6,642,656 | B2 | 11/2003 | Kurashina et al. ............. 313/636 |
| 6,648,638 | B2 | 11/2003 | Castro et al. ...................... 433/8 |
| 6,734,128 | B2 | 5/2004 | Asano ............................ 501/153 |
| 6,740,262 | B2 | 5/2004 | Oshio ............................ 252/584 |
| 6,812,441 | B2 | 11/2004 | Cheng et al. ................... 219/686 |

(Continued)

FOREIGN PATENT DOCUMENTS

| BR | PI9904009 | 5/2009 |
| CH | 697570 | 12/2008 |

(Continued)

OTHER PUBLICATIONS

PCT/US2015/059670 Search Report Dated Jan. 18, 2016.

(Continued)

*Primary Examiner* — Joseph L Williams
(74) *Attorney, Agent, or Firm* — Jason A. Barron (57) ABSTRACT

A translucent alumina substrates, as defined herein, are disclosed along with methods of making translucent alumina substrates via such methods as tape casting. The translucent alumina substrates have advantages over prior filaments due to their quality, including total transmittance, and surface qualities, along with the simplicity of making these materials via scalable processes, such as tape casting.

16 Claims, 7 Drawing Sheets

(56) References Cited

U.S. PATENT DOCUMENTS

| | | |
|---|---|---|
| 6,856,092 B2 | 2/2005 | Pothoven et al. ............ 313/634 |
| 6,878,456 B2 | 4/2005 | Castro et al. ............... 428/542.8 |
| 7,247,591 B2 | 7/2007 | Wei ............................... 501/153 |
| 7,396,792 B2 | 7/2008 | Van Bruggen et al. ....... 501/153 |
| 7,427,577 B2 | 9/2008 | Tang et al. .................... 501/152 |
| 7,538,058 B2 | 5/2009 | Vries et al. ................... 501/153 |
| 7,674,404 B2 | 3/2010 | Osada ...................... 252/519.51 |
| 7,678,465 B2 | 3/2010 | Sambasivan et al. ......... 428/469 |
| 7,678,725 B2 | 3/2010 | Sivaraman et al. ........... 501/153 |
| 7,686,985 B2 | 3/2010 | Osada ...................... 252/519.51 |
| 8,133,051 B2 | 3/2012 | Tsukuma et al. ................. 433/8 |
| 8,158,035 B2 | 4/2012 | Sakaguchi et al. ............ 252/582 |
| 8,211,356 B1 | 7/2012 | Hartnett et al. ............... 264/663 |
| 8,481,439 B2 | 7/2013 | Yamashita et al. ............ 501/127 |
| 2004/0168470 A1 | 9/2004 | Scott et al. ...................... 65/17.2 |
| 2005/0137076 A1 | 6/2005 | Rosenflanz et al. .......... 501/103 |
| 2005/0176850 A1 | 8/2005 | Schmidt et al. ............... 523/160 |
| 2006/0169951 A1 | 8/2006 | Van Bruggen et al. ....... 252/500 |
| 2008/0283522 A1 | 11/2008 | Qin et al. ........................ 220/2.1 |
| 2009/0137380 A1 | 5/2009 | Bernard-Granger et al. . 501/125 |
| 2009/0220787 A1 | 9/2009 | Bernard-Granger et al. . 428/402 |
| 2010/0167907 A1 | 7/2010 | Lee et al. ...................... 501/96.1 |
| 2011/0039685 A1 | 2/2011 | Mao et al. ..................... 501/153 |
| 2011/0281228 A1 | 11/2011 | Hirsch .............................. 433/8 |
| 2012/0267412 A1 | 10/2012 | Miyazawa et al. ................ 225/2 |
| 2012/0306365 A1 | 12/2012 | Du et al. ........................ 313/636 |
| 2013/0256957 A1 | 10/2013 | Ishigami et al. ............... 264/604 |
| 2014/0130972 A1 | 5/2014 | Ren et al. ...................... 156/249 |
| 2014/0191373 A1 | 7/2014 | Iwasaki et al. ................ 257/618 |
| 2014/0336032 A1 | 11/2014 | Alahrache et al. ............. 501/10 |
| 2014/0360345 A1 | 12/2014 | Schnetter et al. ............ 89/36.02 |

FOREIGN PATENT DOCUMENTS

| | | |
|---|---|---|
| CN | 1235942 | 11/1999 |
| CN | 1614102 | 5/2005 |
| CN | 1712574 | 12/2005 |
| CN | 1285538 | 11/2006 |
| CN | 1308988 | 4/2007 |
| CN | 1948221 | 4/2007 |
| CN | 101033139 | 9/2007 |
| CN | 101058483 A | 10/2007 |
| CN | 100384780 | 4/2008 |
| CN | 101215172 | 7/2008 |
| CN | 101224974 | 7/2008 |
| CN | 101320796 | 12/2008 |
| CN | 100506750 | 7/2009 |
| CN | 101568206 | 10/2009 |
| CN | 101792869 | 8/2010 |
| CN | 101058483 B | 12/2010 |
| CN | 101955366 | 1/2011 |
| CN | 102093038 | 6/2011 |
| CN | 102167567 A | 8/2011 |
| CN | 102206098 | 10/2011 |
| CN | 102249552 | 11/2011 |
| CN | 1919762 | 2/2012 |
| CN | 102627450 | 8/2012 |
| CN | 102303174 | 12/2012 |
| CN | 102947246 | 2/2013 |
| CN | 102992739 | 3/2013 |
| CN | 102992780 | 3/2013 |
| CN | 102992809 | 3/2013 |
| CN | 103011902 A | 4/2013 |
| CN | 102167567 B | 6/2013 |
| CN | 102173759 | 9/2013 |
| CN | 103387391 | 11/2013 |
| CN | 103435357 A | 12/2013 |
| CN | 103601476 | 2/2014 |
| CN | 103664173 A | 3/2014 |
| CN | 102674818 | 4/2014 |
| CN | 103011902 B | 6/2014 |
| CN | 102515563 | 7/2014 |
| CN | 103435357 B | 11/2014 |
| CN | 104230348 | 12/2015 |
| JP | 2012209281 | 10/2012 |
| JP | 2014116227 | 6/2014 |
| RU | 2083531 | 7/1997 |
| RU | 2117631 | 8/1998 |
| WO | 2007/065914 | 6/2007 |
| WO | 2009/050320 | 4/2009 |
| WO | 2011/012125 | 2/2011 |
| WO | 2011/036327 | 3/2011 |
| WO | 2011036102 | 3/2011 |
| WO | 2013/054219 | 4/2013 |
| WO | 2014/199975 | 12/2014 |
| WO | 2015/008694 | 1/2015 |

OTHER PUBLICATIONS

CN201520536904.6 Office Action Dated Nov. 5, 2015.

TRANSLUCENT ALUMINA FILAMENTS AND TAPE CAST METHODS FOR MAKING

This application claims the benefit of priority under 35 U.S.C. §119 of U.S. Provisional Application Ser. No. 62/077,437, filed on Nov. 10, 2014, the content of which is relied upon and incorporated herein by reference in its entirety.

The entire disclosure of publications and patent documents mentioned herein are incorporated by reference.

BACKGROUND

The present disclosure generally relates to LED light bulbs comprising alumina filaments, the alumina filaments, and a methods, such as tape casting, for making thin translucent alumina filaments.

SUMMARY

A first aspect comprises a light bulb comprising an alumina filament, one or more LEDs in contact with the alumina filament and which radiate light partially through the alumina filament, and a phosphor coating over at least part of both the LEDs and the alumina filament, wherein the alumina filament: i. comprises a three-dimensional monolithic structure having a height and width that are less than ⅕ the length of the filament with the exception that the height is 500 mm or less, wherein a) the alumina filament has at least one unmodified surface such that the unmodified surface includes grains with an average height from about 25 nm to about 10 µm protruding therefrom, and b) whereby the unmodified surface facilitates attachment of the phosphor coating; and ii. has a total transmittance of at least 30%.

Regarding the first aspect, in some embodiments, the at least one unmodified surface of the alumina filament has a flatness of from about 5 µm to about 50 µm over a distance of 1 cm along a single axis. In some embodiments, the at least one unmodified surface of the alumina filament has a roughness of from about 1 nm to about 10 µm. In some embodiments, the total transmission through the alumina filament is from about 50% to about 85% from about 300 nm to about 800 nm when the alumina filament has a thickness of 200-500 µm. In some embodiments, the alumina filament has one or more recesses, holes, or channels capable of holding a light emitting diode. In some embodiments, the light bulb comprises ten or more LEDs that are located in the one or more recesses, holes, or channels of the alumina filament. In some embodiments, the alumina filament is made from the alumina powder having a median particle size diameter of from 50 to 500 nanometers and a BET surface area of from 2 to 30 m$^2$/g. In some embodiments, the bulb comprises one or more alumina filaments and has a light emission greater than 70 lumens. In some embodiments, the one or more LEDs emit light at a wavelength from about 425 nm to about 500 nm. In some embodiments, the correlated color temperature of light emitted by the bulb is from about 2500K to about 3500K. In some embodiments, the alumina filament comprises a tape casted alumina powder, wherein the alumina powder comprises from 99.5% to 99.995 wt % alumina and from about 100 to about 1000 ppm of a sintering additive, such as MgO.

A second aspect comprises a light bulb comprising an alumina plate, one or more LEDs in contact with the alumina plate and which radiate light partially through the alumina plate, and a phosphor coating over at least part of both the LEDs and the alumina plate, wherein the alumina plate: i. comprises a three-dimensional monolithic structure having two major dimensions, x and y, and a thickness, n, wherein at least one of x or y is at least 10 times larger than the thickness, with the proviso that neither x or y is greater than 100 min and n is about 1 mm or less; wherein a) the alumina substrate has at least one unmodified surface such that the unmodified surface includes grains with an average height from about 25 nm to about 10 µm protruding therefrom, and b) whereby the unmodified surface facilitates attachment of the phosphor coating; and ii. has a total transmittance of at least 30%.

Regarding the second aspect, in some embodiments, the at least one unmodified surface of the alumina plate has a flatness of from about 5 µm to about 50 µm over a distance of 1 cm along a single axis. In some embodiments, the at least one unmodified surface of the alumina plate has a roughness of from about 1 nm to about 10 µm. In some embodiments, the total transmission through the alumina plate is from about 50% to about 85% from about 300 nm to about 800 nm when the alumina plate has a thickness of 200-500 µm. In some embodiments, the alumina plate has one or more recesses, holes, or channels capable of holding a light emitting diode. In some embodiments, the light bulb comprises ten or more LEDs that are located in the one or more recesses, holes, or channels of the alumina plate. In some embodiments, the alumina plate is made from the alumina powder having a median particle size diameter of from 50 to 500 nanometers and a BET surface area of from 2 to 30 m$^2$/g. In some embodiments, the bulb comprises one or more alumina plate and has a light emission greater than 70 lumens. In some embodiments, the one or more LEDs emit light at a wavelength from about 425 nm to about 500 nm. In some embodiments, the correlated color temperature of light emitted by the bulb is from about 2500K to about 3500K. In some embodiments, the alumina plate comprises a tape casted alumina powder, wherein the alumina powder comprises from 99.5% to 99.995 wt % alumina and from about 100 to about 1000 ppm of a sintering additive, such as MgO.

A third aspect comprises a device incorporating one or more of the light bulbs described herein.

A fourth aspect comprises a method of forming a light bulb as described herein, the method comprising tape casting an alumina slurry to form a green tape of an alumina substrate; firing the green tape for a sufficient time and temperature to provide the alumina filament or alumina plate; sectioning the alumina substrate into alumina filaments or alumina plates; contacting one or more LEDs to the alumina filament or alumina plate; and coating phosphor over at least part of both the LEDs and the alumina filament or alumina plate. In some embodiments, the method further comprises attaching the filaments or plates to electronics. In some embodiments, the method further comprises sealing the alumina filament or plate in a glass light bulb and filling the bulb with an inert gas.

A fifth aspect comprises a method of making a tape casted, translucent alumina filament or plate precursor, comprising: attrition milling, for from 10 min to 10 hrs to form a slurry, a batch mixture comprising an alumina powder having a mean particle size of from 50 to 500 nanometers, a binder, a dispersant, a plasticizer, a defoaming agent, and an aqueous or non-aqueous solvent; degasing the resulting isolated slurry under vacuum; tape casting the degased slurry to a wet thickness of from 20 to 2,000 micrometers; controlled drying using an under-bed heater and heated flowing air at from 20 to 100° C. of the tape casted slurry to form a green tape having a dry thickness of from 5 to 1,000 micrometers; and firing the green tape for a sufficient time and temperature to provide a sintered translucent alumina filament or plate precursor. In some embodiments of the fifth aspect, the method further comprises sectioning the translucent alumina filament or plate precursor into one or more alumina filaments or plates. In the case of alumina filaments, the precursor may be sectioned into filaments having a height and width that are less than ⅕ the length of the filament with the exception that the height is 500 μm are less. In the case of alumina plates, the precursor may be sectioned into plates having alumina plate: i. comprises a three-dimensional monolithic structure having two major dimensions, x and y, and a thickness, n, wherein at least one of x or y is at least 10 times larger than the thickness, with the proviso that neither x or y is greater than 100 mm and n is about 1 mm or less.

In some embodiments, the translucent alumina powder, prior to introduction into the slurry, has a BET surface area of from 2 to 30 $m^2/g$, and the microstructure of the green tape is homogeneous. In some embodiments, the alumina powder has a ceramic solids loading in the slurry of from 5 to 60 vol %, and the green tape has a ceramic solids loading of from 35 to 85 vol %. In some embodiments, the green tape has a porosity of from about 0.01 to about 25 vol % In some embodiments, the translucent alumina filament or plate precursor is insensitive to slight variations in either the amount of the binder in the tape cast slurry or the amount of the porosity, if the green tape ceramic solids loading is greater than 45 volume percent.

Regarding conditions under which methods described herein may occur, in embodiments where the solvent is aqueous, the aqueous solvent may comprise deionized water, and the binder, dispersant, plasticizer, defoaming agent, and aqueous solvent have a pH from 8 to 12. In some embodiments, at least one step of the method is accomplished in a particulate controlled environment. In some embodiments, the degased slurry is filtered to remove contaminants.

In some embodiments, firing comprises hydrogen firing, hot pressing, vacuum firing, or hot isostatic pressing. In some embodiments, firing the green tape comprises: sintering the green tape and accomplishing binder burn out at 1000 to 1650° C. for 2 to 8 hrs to obtain a sintered translucent alumina filament or plate precursor; hydrogen firing, hot pressing, vacuum firing, or hot isostatic pressing the sintered translucent alumina filament or plate precursor at 1300 to 1600° C. for 4 to 12 hr, and a pressure of from 5 to 60 kpsi to reduce residual porosity in the sintered translucent alumina filament or plate precursor, wherein the total porosity of the sintered translucent alumina filament or plate precursor after hot isostatic pressing is less than about 500 ppm.

In some embodiments, the method further comprises laminating the green tape into a plurality of green tape layers and then firing to provide a laminated translucent alumina filament or plate precursor.

BRIEF DESCRIPTION OF THE DRAWINGS

The accompanying drawings are included to provide a further understanding, and are incorporated in and constitute a part of this specification.

FIG. 4C is a drawing showing what the same surface of a translucent alumina filament looks like when it has been subjected to cutting, polishing, or other processes, while

DETAILED DESCRIPTION

Before the present materials, articles, and/or methods are disclosed and described, it is to be understood that the aspects described below are not limited to specific compounds, synthetic methods, or uses as such may, of course, vary. It is also to be understood that the terminology used herein is for the purpose of describing particular aspects only and is not intended to be limiting.

In this specification and in the claims that follow, reference will be made to a number of terms that shall be defined to have the following meanings:

Throughout this specification, unless the context requires otherwise, the word "comprise," or variations such as "comprises" or "comprising," will be understood to imply the inclusion of a stated integer or step or group of integers or steps but not the exclusion of any other integer or step or group of integers or steps. Where comprise, or variations thereof, appears the terms "consists essentially of" or "consists of" may be substituted As used in the specification and the appended claims, the singular forms "a," "an" and "the" include plural referents unless the context clearly dictates otherwise. Thus, for example, reference to "a pharmaceutical carrier" includes mixtures of two or more such carriers, and the like.

"Optional" or "optionally" means that the subsequently described event or circumstance can or cannot occur, and that the description includes instances where the event or circumstance occurs and instances where it does not.

Ranges may be expressed herein as from "about" one particular value, and/or to "about" another particular value. When such a range is expressed, another aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

"Volume percent solids loading," "vol % solids loading," or like expressions refer to the inorganic solids in the material, e.g., the cast tape. Vol % solids loading only takes into account the inorganic components (i.e., alumina). Typical vol % solids loading can be, for example, from 5 to 85 vol %, from 5 to 60 vol %, from 35 to 85 vol %, from 50 to 75 vol %, etc., including intermediate values and ranges.

"Transmittance" refers to the fraction of incident light at a specified wavelength that passes through a sample. "Total Transmittance," as used herein, describes the total light transmission through the sample and is the sum of the regular transmission and the diffuse transmission.

"Translucent" as used herein, refers to the property of the alumina filament to pass light through its structure, but wherein the light has a diffuse transmittance of greater than 10%.

Abbreviations, which are well known to one of ordinary skill in the art, may be used (e.g., "h" or "hrs" for hour or hours, "g" or "gm" for gram(s), "mL" for milliliters, and "rt" for room temperature, "nm" for nanometers, and like abbreviations).

Specific and preferred values disclosed for components, ingredients, additives, dimensions, conditions, times, and like aspects, and ranges thereof, are for illustration only; they do not exclude other defined values or other values within defined ranges. The composition and methods of the disclosure can include any value or any combination of the values, specific values, more specific values, and preferred values described herein, including explicit or implicit intermediate values and ranges.

Light emitting diode (LED) lighting has gained prominence due to its energy efficiency, and declining cost. It is projected to become a $30B business by 2020. Currently, LED lighting is widely used specialize applications like outdoor lighting, auto headlights, TV backlights, etc. However, general lighting, such as for the home and office, is becoming a larger market for LED lighting and growing rapidly, due, at least in part, to bans on traditional incandescent bulbs. However, there are two major issues related to normal LED bulbs: cost and style. The current cost of LED bulbs is around $8-12 for 40-60 W. Also, most LED bulbs have non-traditional styling, with a large heat sink at the bottom. Not only is there some resistance to the new bulb styles but in addition, many LED bulb designs lack omnidirectional light emission, and tend to direct a majority of the light upwards towards the ceiling.

LED filament bulbs are a new bulb design that has the same look as the old style Edison bulb, but instead of tungsten-wire filament, it uses several LED filaments in place of the traditional wire. The filament structure is shown in the drawings in FIGS. 1A-1F. There are three key components: the substrate (100), optional metal contacts (110), a string of one or more LED chips (120), and the phosphor coating (130). Alternative designs utilize the same basic components, but instead of a filament structure, may use alternative designs, such as circular, square or rectangular substrates. Among the four components, the contacts, LED chips and phosphors are well-developed technologies that are readily available. However, finding substrates (100) that meet the necessary requirements for these devices has been a challenge.

Currently, three materials are used for the substrate: glass, sapphire and translucent alumina. For LED applications, heat conduction is a critical requirement for the device. Due to its low thermal conductivity, the glass substrate approach has mostly been phased out, especially for the higher power (light emission) product. Sapphire is commonly used as the substrate because it has good transparency and excellent thermal conductivity (30 W/mK). The problem is that sapphire tends to be rather costly, even when using defect-incorporating sapphire. The third alternative, translucent alumina, has similar thermal conductivity properties to sapphire, but with a lower transparency. Potential current methods of making thin sheets of translucent alumina involve dry pressing alumina powder into blocks of alumina, which is then fired in a hydrogen furnace or hot isostatic pressing to full density. Once sintered, the block is wire sawed into thin sheets, ground and polished to produce the final translucent alumina filament. Unfortunately, because of the significant amount processing to get translucent alumina filament, the cost of making these filaments is comparable to sapphire.

Aspects described herein relate to LED light bulbs that incorporate novel alumina substrates that overcome the limitations in the prior art. Unexpectedly, the alumina substrates are capable of being used essentially as formed because they are produced with correct dimensions along at least two axes. And because costly processing steps such as hot isostatic pressing, wire sawing and polishing are not necessary, the formation are very inexpensive. These cost saving result in significant savings in the overall cost of the light bulb. Further, tape casting processes are capable of forming large quantities of materials, providing a large volume of substrates. Additionally, the tape casting processes described herein provide a translucent alumina substrate which has an unmodified surface that can be designed with channels or recesses and has a rough structure that increases surface area to provide more adhesion points for the phosphor.

Translucent Alumina Filaments and Plates and LED Bulbs

A first aspect includes a light bulb comprising a translucent alumina filament wherein the filament is characterized by a three-dimensional monolithic structure. In some embodiments, the translucent alumina filament has a height and/or width that are less than ¼, ⅕, ⅙, 1/7, ⅛, 1/9, 1/10 or 1/20 the length of the filament. In some embodiments, the height and/or width are at most 1 mm, 750 µm, 500 µm, 400 µm, 300 µm, or 250 µm are less. In some embodiments, the translucent alumina filament has dimensions of from about 250 µm to about 1 mm in width, 250 µm to about 1 mm in height, and 20 mm to 50 mm in length.

Figure 7A:
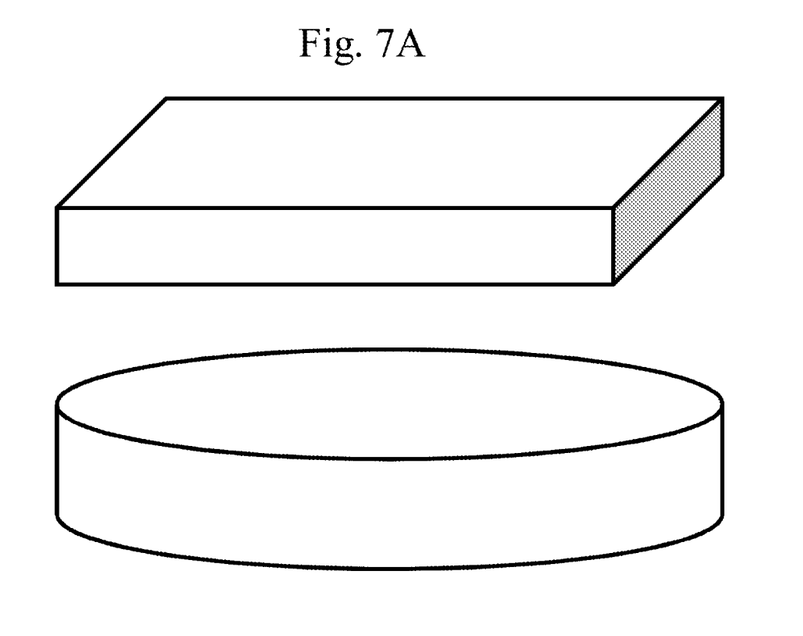
FIGS. 7A and 7B provide a number of example embodiments of translucent alumina plate designs as described herein.

A second aspect comprises a light bulb comprising a translucent alumina plate, wherein the alumina plate is characterized by a three-dimensional monolithic structure. In some embodiments, the translucent alumina plate comprises a three-dimensional monolithic structure having two major dimensions, x and y, and a thickness, n, wherein at least one of x or y is at least 5, 8, 10, 15, or 20 times larger than the thickness, with the proviso that neither x or y is greater than 25, 50, 75, 100, 150, or 200 mm and n is about 0.2, 0.3, 0.4, 0.5, 0.6, 0.7, 0.8, 0.9, 1, 1.2, 1.5, or 2 mm or less. For example, in the x- and y-direction, the translucent alumina plate may take the form of a square, rectangle, circle, oval, etc. Example embodiments of translucent alumina plate designs are shown in FIG. 7A.

Figure 4A:
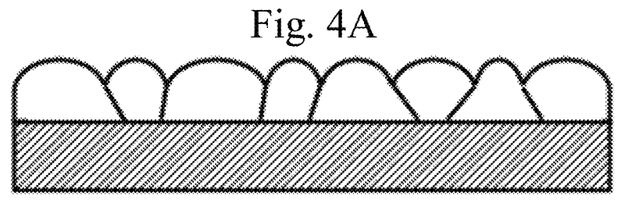
FIG. 4A is a drawing roughly showing what the unmodified surface of a translucent alumina filament looks like in cross section and FIG. 4B shows what that same surface looks like from the top down via atomic force microscopy. The total length of one side of FIG. 4B is 150 μm.
Figure 4B:
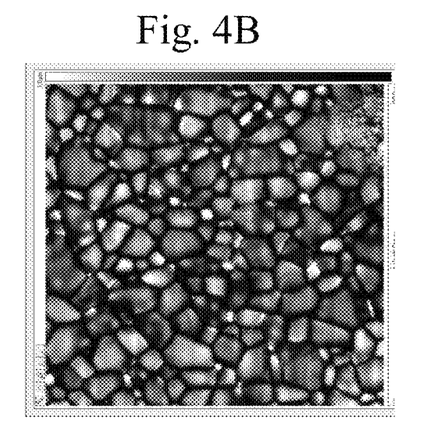
Figure 4C:
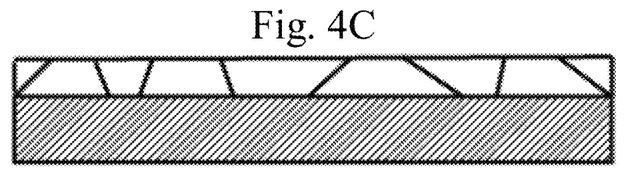
Figure 4D:
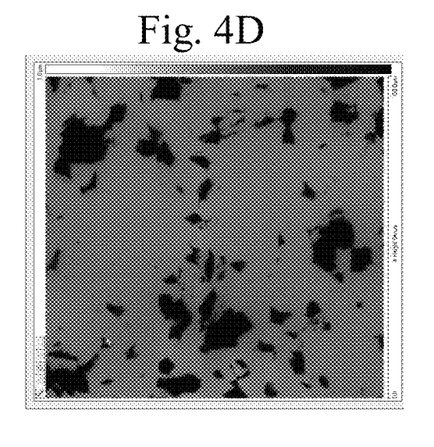
FIG. 4D is a top down view of an AFM picture of a polished translucent alumina filament. The total length of one side of FIG. 4D is 150 μm.

Critically in some embodiments, the translucent alumina filament or plate (collectively, "substrate") has at least one unmodified surface. The unmodified surface comprises a surface that has not been subjected to any finishing steps, such as cutting, polishing, or smoothing. FIGS. 4A-4D provide comparison drawings FIG. 4A vs. FIG. 4C and atomic force micrographs FIG. 4B vs. FIG. 4D that show the unmodified surface of the embodied tape cast translucent alumina (FIG. 4B) in comparison to the cut and polished alumina made by alternative processes, such as the tradition dry pressed alumina (FIG. 4D). As can be seen in FIG. 4A, the unmodified surface includes topographical features, or grains. FIG. 4B is an AFM micrograph showing the unmodified surface of the translucent substrate. These grains have an average height of at least about 25 nm. In some embodiments, the grains have features from about 25 nm to about 10 µm. In some embodiments, the grains have features from about 25 nm to about 1 µm. In some embodiments, the unmodified surface has a roughness from about 10 to about 1000 nm across a distance of 10 mm in one dimension, e.g., along the length of the substrate. Comparatively, FIG. 4C is a drawing showing the modified surface, which has been cut and polished, as would be seen in traditional methods of forming an alumina substrate. The surface is extremely smooth, with no surface features. FIG. 4D is an AFM micrograph presenting the polished surface. The dark spots are places where grains have separated from the surface during handling, but which would normally not be present in the end product. However, as can be seen, the overall surface is extremely smooth and flat with essentially no topology. In contemplated embodiments, the surface may be modified in a superficial manner, such as by scratching or coarse polishing, where the surface profile still includes the grains disclosed herein. Applicants consider such superficial modification "unmodified" because the surface retains the granular structure as shown in FIG. 4B, such as where grain boundaries are visible in microscopy and the surface retains the roughness and grain profiles of the ranges disclosed herein.

The flatness of the alumina substrate can be important for LED placement and, in some embodiments, conformity with specifications in the light bulb. In some embodiments, the unmodified surface of the alumina substrate has a flatness of from about 0.1 µm to about 50 µm over a distance of 1 cm along a single axis, e.g., the length of the filament.

Figure 3A:
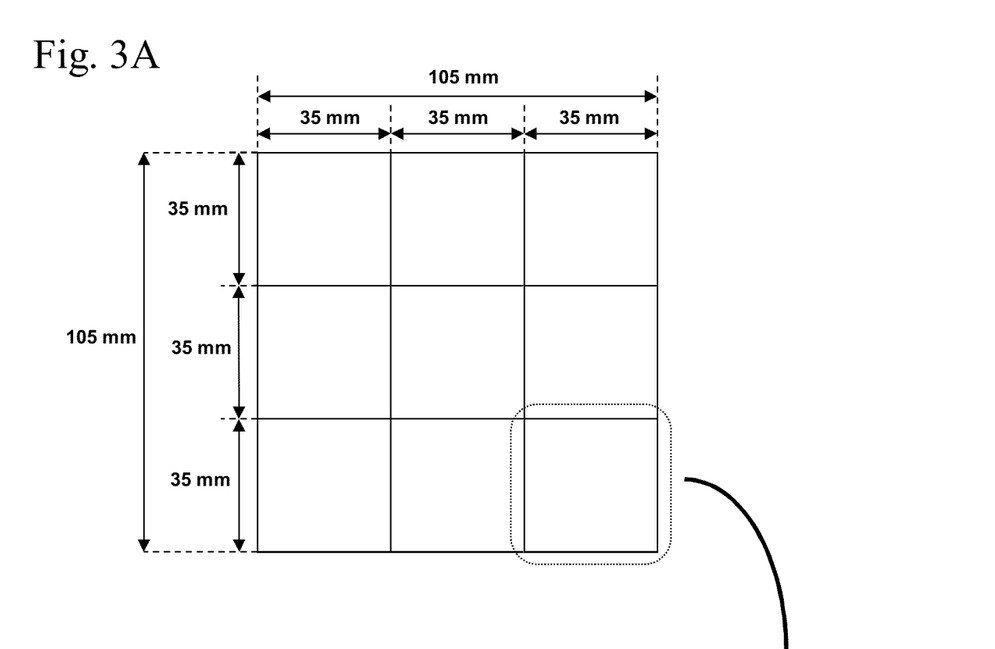
FIG. 3A is a schematic drawing of an example output plate from a tape casting process wherein the tape cast sheet is subdivided into multiple singulated substrates (9 in this case) with dimensions of 35 mm by 35 mm.
Figure 3B:
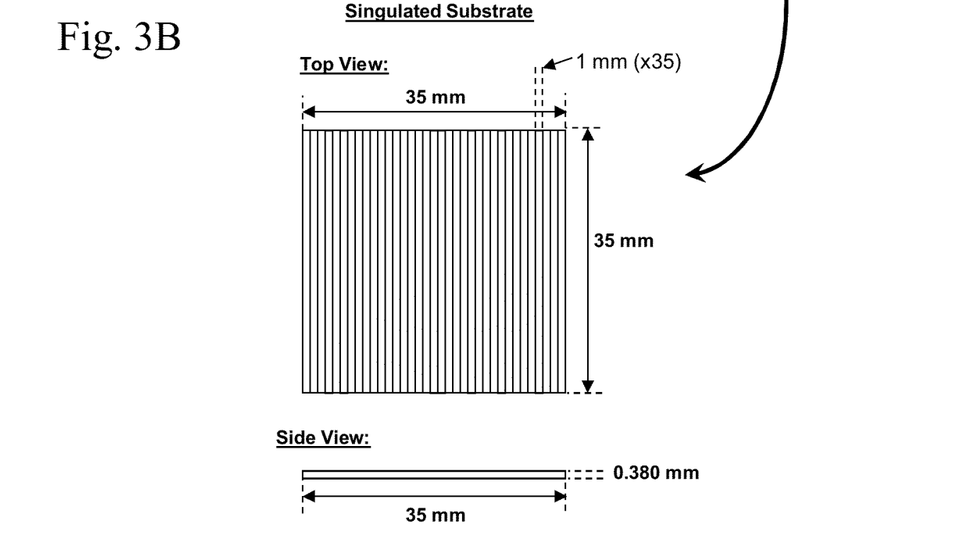
FIG. 3B shows a singulated substrate with singulation lines pressed into its surface. The singulated substrate is sectioned into a multitude of translucent alumina filaments at the singulation lines, each filament being ~1 mm wide by ~0.380 mm thick by ~35 mm long.

The translucent alumina substrate substrates can be made from a translucent alumina filament or plate (collectively "substrate") precursor, optionally having singulation features. In some embodiments, it is most efficient and provides structures with the best overall flatness (i.e., less large distance distortion) if the substrates are cast in larger blocks or tapes and then sectioned into the individual substrate. As shown by FIGS. 3A and 3B, the tape can have the correct thickness and then be sectioned into precursors having the correct length and then cut into the right widths through known cutting or sectioning methods.

As noted, the alumina substrates described herein are translucent. The transparency of the alumina substrate is not critical as the light is further diffused by the phosphor layer coating the LEDs and filament and the desire for light bulbs comprising the translucent alumina substrates is to obtain a disperse emission. While transparency is not critical, it is desirable that as much light exits the bulb as possible. Therefore, the translucent alumina substrates should not absorb significant amounts of the light emitted by the LEDs and/or the phosphor. In some embodiments, the translucent alumina substrates have a total transmittance of at least 30% from about 300 nm to about 800 nm when the alumina substrate has a thickness of 500 µm. In some embodiments, the total transmission through the alumina substrate is from about 50% to about 85% from about 300 nm to about 800 nm when the alumina substrate has a thickness of 500 µm. In some embodiments, the diffuse transmission through the alumina substrate is from about 10 to about 60% from about 300 nm to about 800 nm when the alumina substrate has a thickness of 500 µm. In contemplated embodiments, the translucent alumina may have the above-disclosed transmittance percentages with a wavelength in the above-disclosed ranges but with other thicknesses, such as any of the other thicknesses disclosed herein.

Figure 5A:
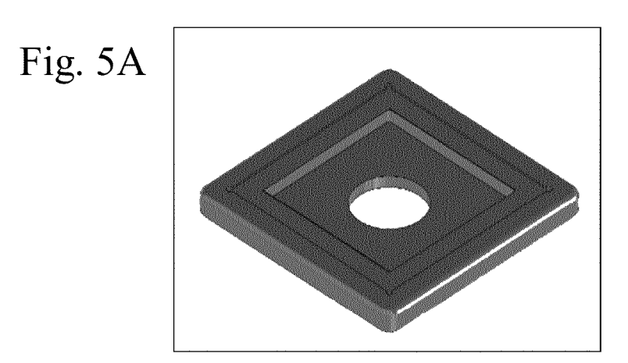
FIG. 5A is a drawing of an example base for a die for pressing lines into the tape cast structure prior to sintering.
Figure 5B:
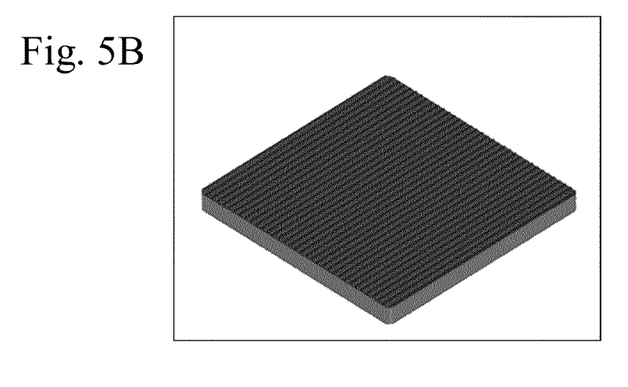
FIG. 5B is the die insert with the line structure for producing singulated substrates that allows for easier sectioning of the substrate into filaments.
Figure 5C:
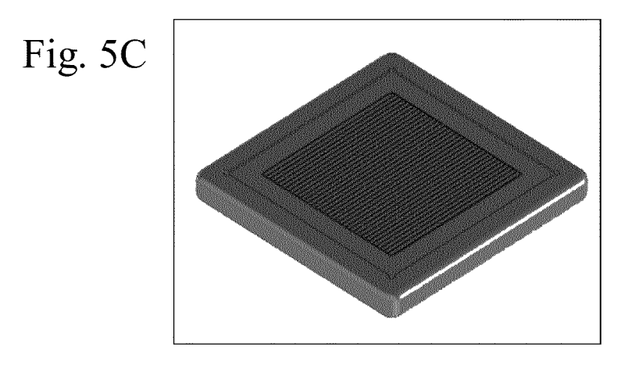
FIG. 5C is a drawing showing the combination of the die and insert shown in FIG. 5A and FIG. 5B.

In some embodiments, it is advantageous to have the alumina substrate precursors incorporate singulation features. Such features may comprise lines or grooves that are pressed into the precursor to aid in singulating the substrates after sintering. FIGS. 5A-5C show one example die for integrating singulation features into the precursor. The die comprises a die (FIG. 5A) and die insert (FIG. 5B), where the insert has the singulation features. The die is used, as described below, with the green tape to press singulation features into the tape.

The LEDs used in the LED light bulbs are well known in the art and the LEDs embodied herein can comprise any LEDs that work with the substrate and phosphor and provide the correct light output. In some embodiments, the LEDs used are blue LEDs, such as InGaN, that provide light in the wavelength range from about 425 nm to about 500 nm. In terms of the number of LEDs, each substrate can have from one to 40 or more LEDs placed on it.

The phosphor coating comprises materials that work with the LEDs to provide a light with a desirable color temperature. In some embodiments, the phosphor comprises a $Y_3Al_5O_{12}$:Ce (YAG) material, an aluminate material, a nitride material, a silicate material, etc. In some embodiments, the correlated color temperature of light emitted by the bulb is from about 2500K to about 3500K. This color temperature range provides a light that feels "warm" (i.e., more yellow and white than blue—similar to an incandescent bulb) to "neutral." In some embodiments, the correlated color temperature of light emitted by the bulb is from about 2600K to about 2900K. Alternatively, in some embodiments it is desirable to have a "cooler" blue light. By tailoring the LEDs and/or phosphors, the light bulbs described herein can be tailored to have a color output from 2500K all the way to 10,000K, as desired by the application.

Figure 6A:
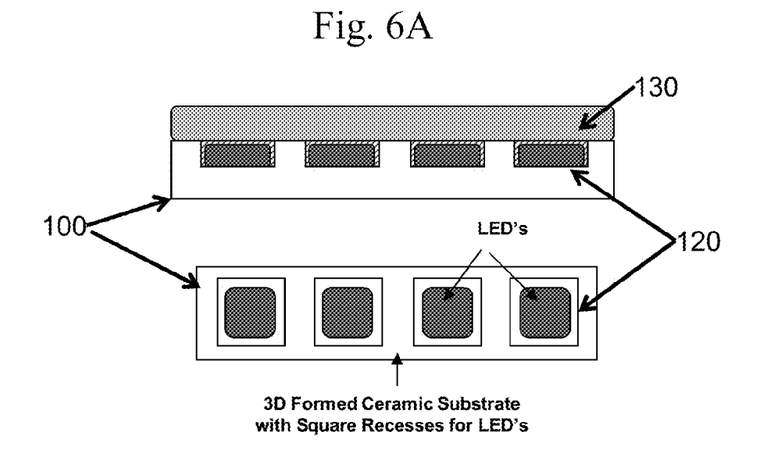
FIG. 6A provides a side view and top-down view of an example translucent alumina filament (100), with LEDs (120) placed in recesses in the filament and a phosphor (130) overtop.
Figure 6B:
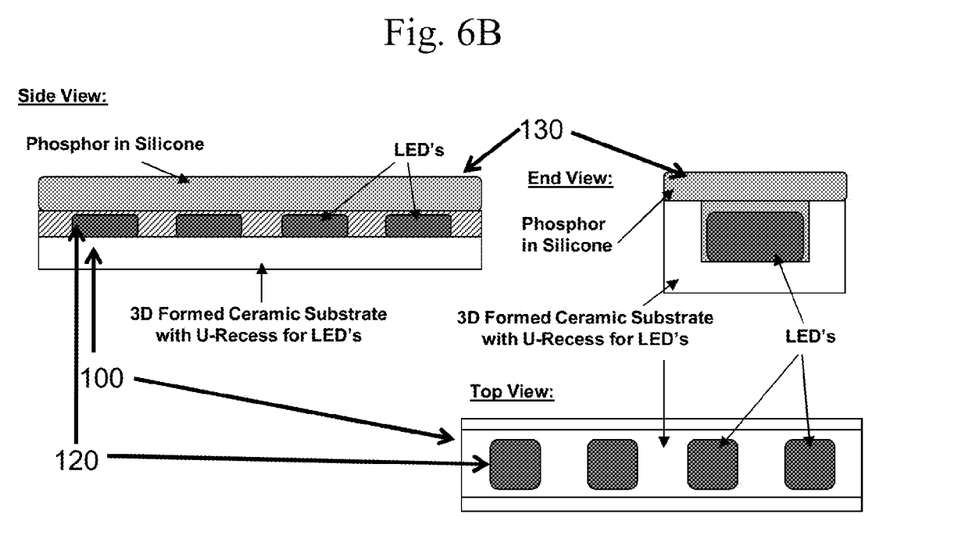
FIG. 6B provides a side view, end view, and top view of an alternative embodiment where the translucent alumina filament (100) has a U-shaped channel structure with the LEDs (120) placed therein, and a phosphor (130) overtop.
Figure 7B:
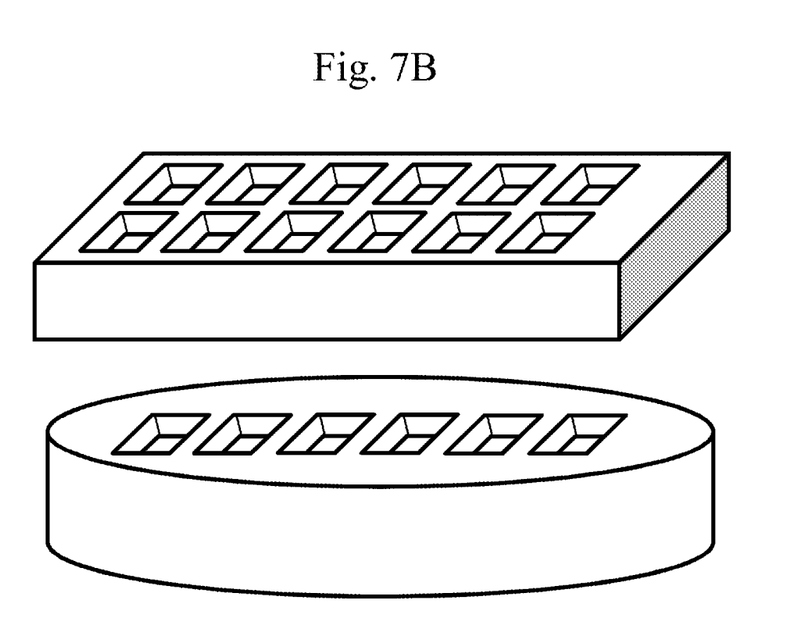

In some embodiments, the alumina substrates further comprise one or more recesses, holes, or channels capable of holding a light emitting diode. These recesses, holes or channels can be incorporated into the substrate at the green tape stage via a blanking process (described below) or may be made after the sectioning, singulation, or sintering process. FIG. 6A provides an example of recesses where an LED is placed in each recess. The recesses protect the LEDs and improve scattering of the light because a significant amount is transmitted through the translucent alumina substrate. FIG. 6B is an alternative design wherein a channel is provided in the translucent alumina substrate. It provides the same protection and scattering advantages of the recesses, but may be more easy to produce, especially in post-sintering processes. Similarly, FIG. 7B provides example embodiments of translucent alumina plates with recesses, holes or channels that are capable of holding a light emitting diode.

In some embodiments, the starting and end material properties play an important role in the overall quality or stability of the translucent alumina substrate. In some embodiments, the alumina substrate is made from the alumina powder having a median particle size diameter of from 50 to 1000 nanometers and a BET surface area of from 2 to 30 $m^2/g$. The alumina substrate is typically made from a tape casted alumina powder comprising from 99.5% to 99.995 wt % alumina and from about 100 to about 1000 ppm of a sintering additive, such as MgO. This produces a high quality translucent alumina substrate.

LED light bulbs incorporating the translucent alumina substrate may further comprise a blown glass bulb, electronics necessary to power or control the LEDs, and necessary connectors. The translucent alumina substrates embodied herein are particularly useful in bulbs comprising one or more alumina substrates and having a light emission greater than 70 lumens. This is, in part, because the translucent alumina substrates are particularly good at dissipating heat. The thermal conductivity of the translucent alumina substrates disclosed herein is around 30 W/mK, similar to sapphire.

Process

Another aspect comprises methods of making the translucent alumina substrates, the disclosure provides both aqueous- and non-aqueous-based tape-casting methods. Methods for making the translucent alumina substrates described herein are similar to those provided in U.S. Prov. Appl. No. 62/019,649, herein incorporated by reference in its entirety. Additionally, general concepts and principles related to tape casting may be found in "Principles of Ceramic Processing" by James S. Reed, 1995, $2^{nd}$ Ed., ISBN-13: 978-0471597216, herein incorporated by reference.

Figure 1A:
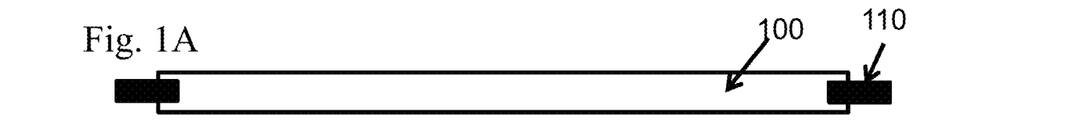
FIG. 1A is a two-dimensional schematic of a LED filament as described herein. The LED filament has a translucent alumina filament (100) and optional metal contacts (110) on one or both ends.
Figure 1B:
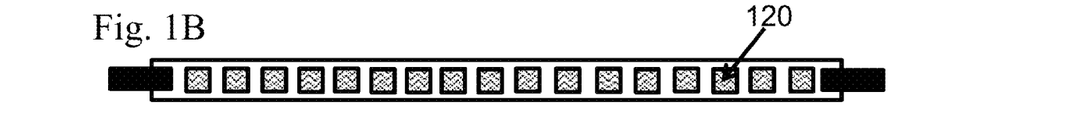
FIG. 1B is a schematic showing multiple LEDs (120) on the translucent alumina filament (100). As described in more detail below, the LEDs may be on one or more surface of the translucent alumina body, or may be located in channels or holes in the translucent alumina body.
Figure 1C:
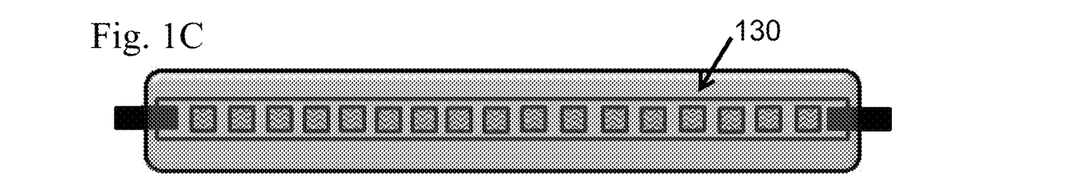
FIG. 1C is a schematic showing the translucent alumina filament (100) with multiple LEDs (120) and a phosphor coating (130) coating the alumina body and the LEDs.
Figure 1D:
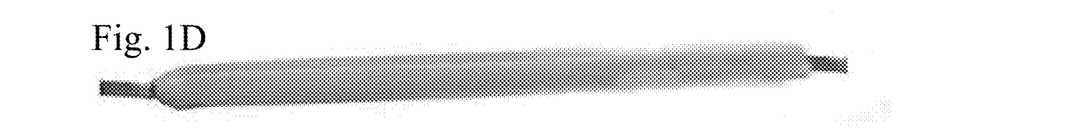
FIG. 1D is an actual picture of the alumina filament wherein the metal contacts (110) and phosphor coating (130) are observable.
Figures 1E, 1F:
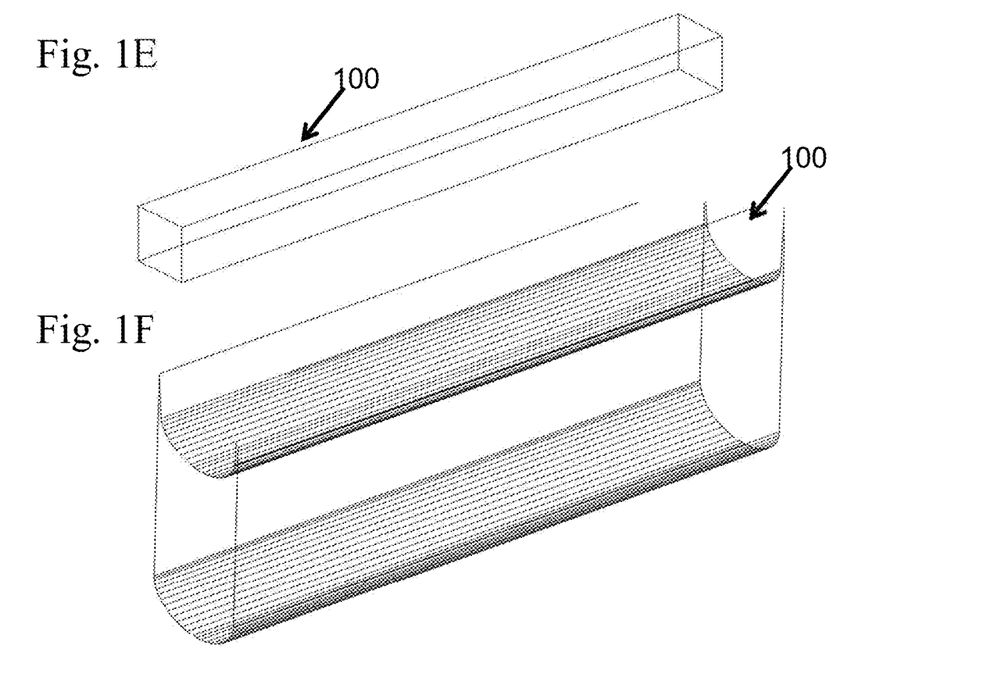
FIG. 1E is a three-dimensional stick diagram of the translucent alumina filament (100) showing one of the many three-dimensional forms it may take.
FIG. 1F is an alternative three-dimensional form for translucent alumina filament (100), wherein the body has a channel along its top surface.
Figure 2:
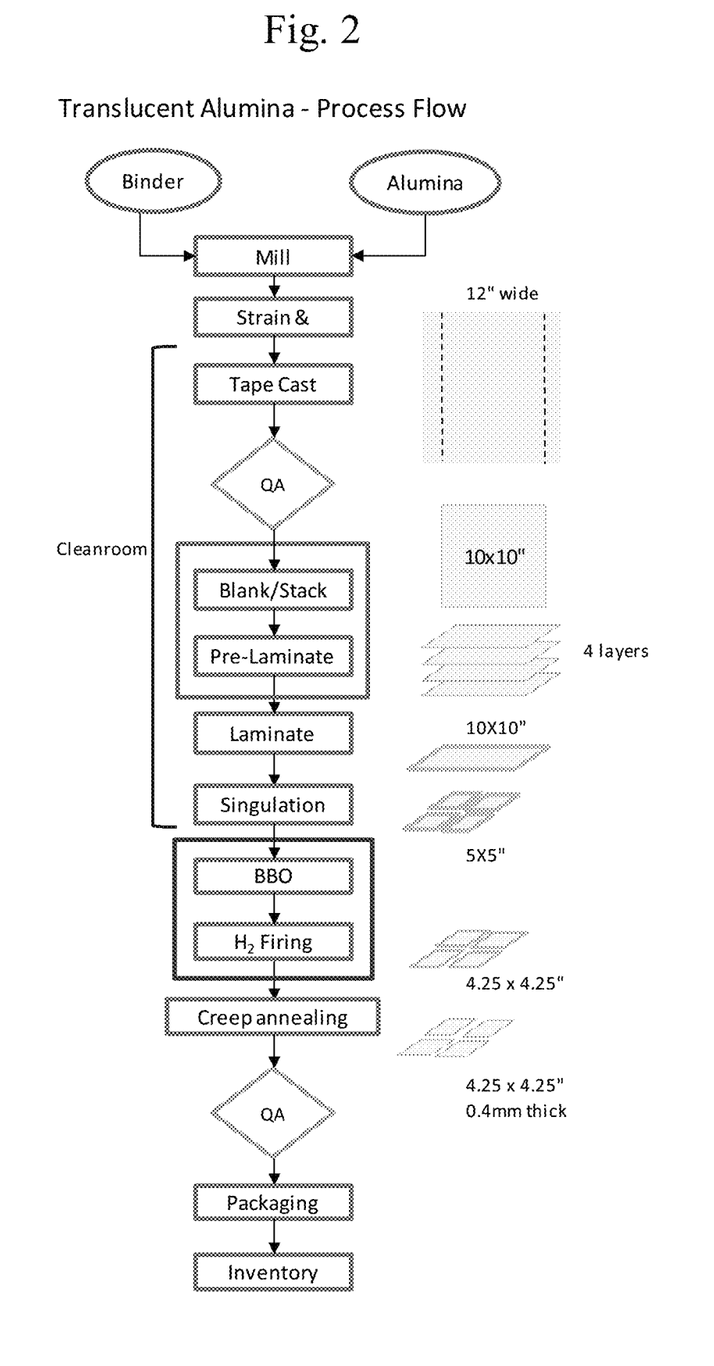
FIG. 2 is a block diagram providing an example of the process flow for tape casting the translucent alumina filament.

Referring to FIG. 2, the following description provides a flow chart for a process of tape casting translucent alumina substrates.

The alumina powder is mixed with in a water-based tape casting system, optionally including a binder, a dispersant, a plasticizer, and a defoaming agent. Alternatively, a solvent-based tape casting system can be used, wherein the translucent alumina tapes can be made with an alcohol such as ethanol, methanol, propanol, butanol, a ketone, such as methyl ethyl ketone, benzene, toluene, etc. For example, one embodiment comprises an ethanol-based solvent system and a polyvinyl butyral binder. Other non-aqueous systems include, for example, polypropylene carbonate (PPC) binders with carbonate solvents such as dimethyl carbonate or diethyl carbonate, and acrylic binders, which "unzip" or depolymerize rather than combust.

The batched materials are mixed and milled, for example by one or more of ball milling, high shear mixing, attrition milling, vibratory milling, roller milling, and like methods. The milling process is a significant step that should provide fully deagglomerated particles and create a uniform, a well dispersed, slurry. In some embodiments, an attrition mill (aka., stirred ball mill), is ideal for achieving deagglomeration of the alumina powder. The attrition mill has benefits over other milling processes and equipment due to the high energy input to the materials during the milling process. This allows a batch to be milled to smaller particle sizes in a shorter period of time compared to other techniques, for example, in 1 to 3 hours versus 50 to 100 hrs with ball milling. In some embodiments, this leads to a more homogenous microstructure in the tape.

The particle size of the alumina powder can be tailored to the application and constraints, but in some embodiments, the alumina powder has a mean particle size of from 50 to 1000 nanometers. In some embodiments, the alumina powder, prior to introduction into the slurry, has a BET surface area of from 2 to 30 $m^2/g$. In some embodiments, the alumina powder has a ceramic solids loading in the slurry of from 5 to 60 vol %, and the green tape has a ceramic solids loading of from 35 to 85 vol %.

In some embodiments, the milling process is done at a controlled temperature, such as 0, 5, 10, or 15° C. to avoid overheating and reduce evaporation of solvent(s). In some embodiments, the slurry can be initially milled for a short period of time (about 5-20 minutes) at low rpm (~4-600 rpm) to break down large agglomerates, then the increased to about 1000-1500 rpm and milled for 30 mins to two hours.

Once the alumina has been milled, the milling media is strained through a mesh screen (e.g., 80 to 120) from the slurry, and the slurry is de-aired/degased using a vacuum. This removes entrapped air from the milled product that would otherwise end up as bubbles within the mix. For example, deairing can be accomplished with a desiccator chamber and then a vacuum planetary mixer. In such an example, the slurry is loaded into a desiccator chamber and de-aired for up to 10 minutes. After the initial deairing, the slurry was loaded into the planetary mixer and operated under vacuum. An alternative deairing procedure is to use a higher vacuum in the desiccator chamber.

Once the degasing process is complete, the slurry is optionally filtered to remove any large scale contamination from the mixture that would otherwise give adverse properties in the sintered material. Filtering can be accomplished with, for example, 100 micrometers, 50 micrometers, 25 micrometers, 10 micrometers, or 1 micrometer filters made of, for example, nylon, fiber, or other suitable materials.

Next, the slurry is tape cast using a doctor blade or other casting setup, at a desired thickness to form a wet, thin sheet of ceramic slurry. The wet thickness of the slurry can be from about 20 to about 20,000 micrometers. Casting is ideally done under clean room conditions, such as a class 100 or class 1000 clean room, to avoid contamination of the alumina. Other steps, such as the milling, de-airing, and lamination steps, can also be done in a clean room to further reduce the contamination levels. In some embodiments, the samples were tape cast on a silicone-coated Mylar® film that was approximately 50 to 500 micrometers thick. The silicone coating provides easy release of the tape material after drying. Other suitable films for tape can be, for example, Teflon®, glass, a metal belt, and like alternative materials. The slurry was passed under a doctor blade which had a gap of about 100 to 1000 micrometers, to form a thin sheet of ceramic tape. The casting blade was moved across the Mylar® at, for example, a speed of 10 mm/sec. The speed can be varied as needed to increase process speed, and modify the thickness of the tape. The wet tape is dried under controlled conditions to form a thin ceramic/polymer composite tape, referred to as a tape in the "green state" or alternatively "green tape", which can be formed to the desired shape.

In some embodiments, the tape is dried under controlled constraints, for example using an under-bed heater and flowing heated air from 20-100° C. over the tape for a time sufficient to dry the tape to the desired level. Generally, the translucent alumina substrate and substrate precursor are insensitive to slight variations in either the amount of the binder in the tape cast slurry or the amount of the porosity. In order to optimize the process, in some embodiments, the green tape has a porosity of from about 0.01 to about 25 vol %.

In some embodiments, the green tape ceramic solids loading is greater than 45 volume percent, e.g., 45%, 50%, 60%, or 70% or greater.

The green tape can be blanked to the desired part geometry from a roll of tape from the tape casting process. Blanking forms the near net shape. The green tape is optionally formed to the desired shape using any suitable ceramic forming techniques, for example: laser cutting; hot knife cutting; punching; stamping; pressing; and like methods, or combinations thereof. Alternatively or additionally, the tape can be fired and then formed to shape in the sintered state using, for example, laser cutting or slicing.

For example, as shown in FIG. 3A and FIG. 3B, the tape can be blanked into multiple singulated substrates that have singulation lines pressed into the surface. In FIG. 3A, the tape is set up as a sheet of nine substrates that has a groove scored into the surface for singulation purposes (alternatively, this can also be put in by laser scoring). Each of the nine substrates is singulated and could be used at that point as alumina plates. Alternatively, in some embodiments, the plates may contain singulation lines that allow for easy sectioning of the plate into filaments (FIG. 3B). Alternatively, it is possible that filament cutting take place before singulation of the nine squares. Dimensions of a singulated parts are listed as 1×35×0.35 mm, but can be of any size that is necessary for the application. The range of capabilities for the manufacturing processes is not limited to the dimensions, which are given as examples. Optionally, the final parts can be finished in the green state, or in a post sintering process, for example, with various finishing methods, such as cutting, polishing, and like finish operations.

Optionally, blanked layers can be stacked to achieve a greater part thickness. Interleaf material can be inserted between stacked parts as needed to laminate multiple parts at the same time under the same lamination process conditions. The multiple layers of the ceramic tape can be stacked and laminated using uniaxial or isostatic pressing to create a thicker tape. In the case where lamination is necessary or desirable, the blanking, stamping or singulation processes (e.g., FIG. 3A and FIG. 3B) can be done after lamination occurs.

In some embodiments, in order to obtain the best result, additional care is necessary when forming laminate structures. For example, the top and bottom surface of the tape may contain different amounts or concentrations of binder and porosity due to drying kinetics. This can result in non-uniform shrinkage in the z-direction (out-of-plane), which can result in part camber. Therefore, in some embodiments, it is optimal to know the casting direction. In order to mitigate the effects of preferential particle orientation during casting, the tapes can be rotated, 90 degrees to one another per layer (alternatively, no rotation, or 180 degree rotation can be used). The tapes are typically stacked on top of one another without flipping. The bottom surface of the first layer is placed on the top surface of the next layer, and the sequence repeated for the desired number of layers. Due to drying kinetics, the bottom surface of the tape will typically contain a higher concentration of binder, while the top surface is more porous. By placing the layers atop of one another the high binder surface is compressed to the porous surface during the lamination process. It is possible to laminate two high binder surfaces together, however if two porous surfaces are laminated typically delamination was observed, unless the binder concentration in the tape is high enough to fill in the pores even at the top surface of the tape. A certain amount of porosity in the green tape is necessary to allow compression during the lamination step. In some embodiments, a 5 to 10% porosity is targeted, but lower or higher porosities may also be satisfactory. Using the desired rotation and stacking technique, the tapes are placed on top of one another and stacked to the desired number of layers. For example, in some embodiments from 4 to 28 layers of a green tape having a thickness of about 40 micrometers each, gave green tape laminates having a thickness of from 160 to 1120 micrometers. However, stacks having several hundred layers are possible if a thicker part is desired.

Once the desired number of layers is achieved, the stack can be placed between two metal plates, vacuum sealed in a bag, and isostatically laminated (alternatively a uniaxial press can be used). Typical pressures are 3,000 to 5,000 psi, at from 60 to 80° C. However, pressures from 1,000 to 10,000 psi, and 60 to 100° C., can be used, or 4,000 to 5,000 psi, at 70° C. For example, the stack sample is placed in a 70° C. preheated laminator and pre-heated for 15 minutes with no or low pressure (e.g., 150 psi). The sample is then ramped to the desired pressure (e.g., 3,000 psi) and held for 15 min After the cycle is complete the pressure is released and the samples are removed from the chamber. The samples are allowed to cool to room temperature and removed from the lamination plates and Mylar carrier film. The sample "part" was then moved to the de-bind/sinter step, or the part can be formed in the green state using a punching or cutting method The tape can be fired in a one- or two-step process. The one-step process removes binder and sinters the tape in a single firing. In the two-step process the binder is removed in one furnace and then the part is sintered to final density in a second furnace. For example, after lamination, the green bodies first go through a binder burnout (BBO) and a sintering process. In some embodiments, the BBO process is done at 1000 to 1650° C. for 2 to 8 hrs. In some embodiments, the second sintering step is done via hydrogen firing, hot pressing, vacuum firing, or hot isostatic pressing the sintered translucent alumina filament precursor at 1300 to 1900° C. for 1 to 12 hr, and a pressure of from 0.5 atm to 4000 atm.

After sintering, the fired spinel body has a very high density (>94%), indicating that substantially all the pores were closed. To eliminate the any residual porosity, hot isostatic pressing (HIP) can be used. A high power graphite furnace can be used for the HIPing ("Ar HIP") process to achieve the high temperatures (e.g., 1,500° C. or above) or alternatively, a "$O_2$ HIP" process can be used (a mixture of 80 vol % Ar and 20 vol % $O_2$ atmosphere, at about 1,000 psi or above (e.g., 10 kpsi or 5,500 psi) and 600° C. above (e.g., 1,100° C.) for several hours. Alternatively, final firing can be achieved using a hydrogen furnace, vacuum furnace, $N_2$ or Ar furnace, or an air furnace. Typical firing temperatures can be, for example, from 1200° C. to 1800° C. In some embodiments, the total porosity of the sintered translucent alumina substrate precursor after sintering is less than about 500 ppm.

After firing, the parts are annealed to remove stress and also to ensure the parts have the correct dimensions via creep annealing. After annealing, the parts go through a quality analysis, and can be packaged and shipped. In some cases the parts are separated into singulated substrates or plates and/or the singulated substrates are sectioned into filaments via laser or mechanical cutting, breaking, grinding, etc.

In the case where the translucent alumina precursors are singulated into filaments or plates, the filaments or plates can then incorporated into LED light bulbs. This is done by optionally contacting the translucent alumina filament or plate with a metal contact, contacting the translucent alumina filament or plate with one or more LEDs, coating phosphor over at least part of both the one or more LEDs and the translucent alumina substrate, and placing the coated translucent alumina substrate in a bulb. In some embodiments, the bulb is filled with an inert gas, such as argon or nitrogen, and sealed. In some embodiments, the bulb further comprises additional electronics for controlling the voltage, current, and or power in the bulb.

The disclosure has been described with reference to various specific embodiments and techniques. However, many variations and modifications are possible while remaining within the scope of the disclosure.

What is claimed is:

1. A light bulb comprising an alumina filament, one or more LEDs in contact with the alumina filament and which radiate light partially through the alumina filament, and a phosphor coating over at least part of both the LEDs and the alumina filament, wherein the alumina filament:
   i. comprises a three-dimensional monolithic structure having two major dimensions, x and y, and a thickness, n, wherein at least one of x or y is at least 10 times larger than the thickness, with the proviso that neither x or y is greater than 100 mm and n is about 1 mm or less; wherein:
      a) the alumina filament has at least one unmodified surface such that the unmodified surface includes grains with an average height from about 25 nm to about 10 µm protruding therefrom, and
      b) whereby the unmodified surface facilitates attachment of the phosphor coating; and
   ii. has a total transmittance of at least 30% when the alumina filament has a thickness of 500 µm.

2. The light bulb of claim 1, wherein the at least one unmodified surface of the alumina filament has a flatness of from about 0.1 µm to about 50 vim over a distance of 1 cm along a single axis.

3. The light bulb of claim 1, wherein the at least one unmodified surface of the alumina filament has a roughness of from about 1 nm to about 10 µm.

4. The light bulb of claim 1, wherein the total transmission through the alumina filament is from about 50% to about 85% from about 300 nm to about 800 nm when the alumina filament has a thickness of from about 200 to 500 µm.

5. The light bulb of claim 1, wherein the alumina filament has one or more recesses, holes, or channels capable of holding a light emitting diode.

6. The light bulb of claim 5, wherein the light bulb comprises five or more LEDs that are located in the one or more recesses, holes, or channels of the alumina filament.

7. The light bulb of claim 1, wherein the alumina filament is made from the alumina powder having a median particle size diameter of from 50 to 1,000 nanometers and a BET surface area of from 2 to 30 $m^2/g$.

8. The light bulb of claim 1, wherein the bulb comprises one or more alumina filaments and has a light emission greater than 70 lumens.

9. The light bulb of claim 1, wherein the one or more LEDs emit light at a wavelength from about 425 nm to about 500 nm.

10. The light bulb of claim 1, wherein the correlated color temperature of light emitted by the bulb is from about 2500K to about 10,000K.

11. The light bulb of claim 1 wherein the alumina filament comprises a tape casted alumina powder, wherein the alumina powder comprises from 99.5% to 99.995 wt % alumina and from about 100 to about 1000 ppm of a sintering additive, such as MgO.

12. A device comprising the light bulb of claim 1.

13. A method of forming the light bulb of claim 1, comprising:
   a. tape casting an alumina slurry to form a green tape of an alumina substrate
   b. firing the green tape for a sufficient time and temperature to provide the alumina filament;
   c. sectioning the alumina substrate into alumina filaments;
   d. contacting one or more LEDs to the alumina filament; and
   e. coating phosphor over at least part of both the LEDs and the alumina filament.

14. The method of claim 13, wherein the method further comprises attaching the filaments to electronics.

15. The method of claim 14, wherein the method further comprises sealing the alumina filament in a glass light bulb and filling the bulb with an inert gas.

16. A light bulb, comprising:
   a transparent alumina filament, the transparent alumina filament having a total transmittance of at least 30% at a wavelength in the range from 300 to 800 nm;
   an LED supported by the alumina filament, wherein the LED radiates at least some light through the transparent alumina filament when the light bulb is on, and
   a phosphor coating surrounding at least part of both the LED and the alumina filament,
   wherein the alumina filament has a surface with a granular profile that includes grains with an average height from about 25 nm to about 10 µm protruding relative to recessed portions of the surface at boundaries between the grains.

* * * * *